United States Patent [19]

Sugikawa

[11] Patent Number: 5,300,165
[45] Date of Patent: Apr. 5, 1994

[54] METHOD FOR MANUFACTURING A METALLIC POROUS SHEET

[75] Inventor: Hirofumi Sugikawa, Toyonaka, Japan

[73] Assignee: Katayama Special Industries, Ltd., Osaka, Japan

[21] Appl. No.: 762,251

[22] Filed: Sep. 19, 1991

Related U.S. Application Data

[63] Continuation of Ser. No. 437,437, Nov. 16, 1989, abandoned.

[30] Foreign Application Priority Data

| Apr. 14, 1989 | [JP] | Japan | 1-96085 |
| Oct. 16, 1989 | [JP] | Japan | 1-270034 |
| Oct. 16, 1989 | [JP] | Japan | 1-270035 |
| Oct. 16, 1989 | [JP] | Japan | 1-270036 |

[51] Int. Cl.$^5$ .................... B32B 31/00
[52] U.S. Cl. .................... 156/150; 29/460; 156/82; 156/192; 156/280; 156/305; 156/324; 205/114; 205/138; 205/148; 205/161; 427/124; 427/243; 427/251; 428/76; 428/247; 428/316.6; 429/209
[58] Field of Search .................... 156/150, 280, 306.3, 156/82, 305, 192, 324; 29/460; 428/76, 247, 316.6; 429/209; 205/114, 148, 138, 161; 427/124, 251, 243

[56] References Cited

U.S. PATENT DOCUMENTS

| 2,074,281 | 3/1937 | Sommer | 427/251 |
| 2,409,295 | 10/1946 | Marvin et al. | 205/148 |
| 3,625,765 | 12/1971 | Arrance et al. | |
| 3,777,704 | 12/1973 | Van Poucke | 427/251 |

FOREIGN PATENT DOCUMENTS

| 0266162 | 5/1988 | European Pat. Off. | |
| 53-28634 | 3/1978 | Japan | 156/192 |
| 55-88272 | 7/1980 | Japan | 156/150 |
| 834744 | 5/1960 | United Kingdom | 427/124 |
| 2176500 | 12/1986 | United Kingdom | |

OTHER PUBLICATIONS

Database WPIL, Week 8319 (Derwent Publications Ltd., London GB) Abstract AN 83-45471K.

*Primary Examiner*—John J. Gallagher
*Attorney, Agent, or Firm*—Wenderoth, Lind & Ponack

[57] ABSTRACT

The disclosure relates to a method for forming a porous sheet comprising a plurality of porous sheets such as foamed sheet, mesh sheet and nonwoven fabric sheet. These sheets are adhered and layered to each other either by a melting or with an adhesive or by layering without each other with adhering these sheets to each other. Then, the porous sheet thus layered is plated at a high current density by forcibly applying plating liquid to the layered sheet in a direction substantially perpendicular thereto in a plating tank, or by vacuum evaporation while the layered sheet is being transported inside the vapor deposition vacuum container enclosed by a cooking tank through a cooling roller mounted therein. The metallic porous sheet formed according the above-described method is preferably used as the electrode of a battery.

6 Claims, 9 Drawing Sheets

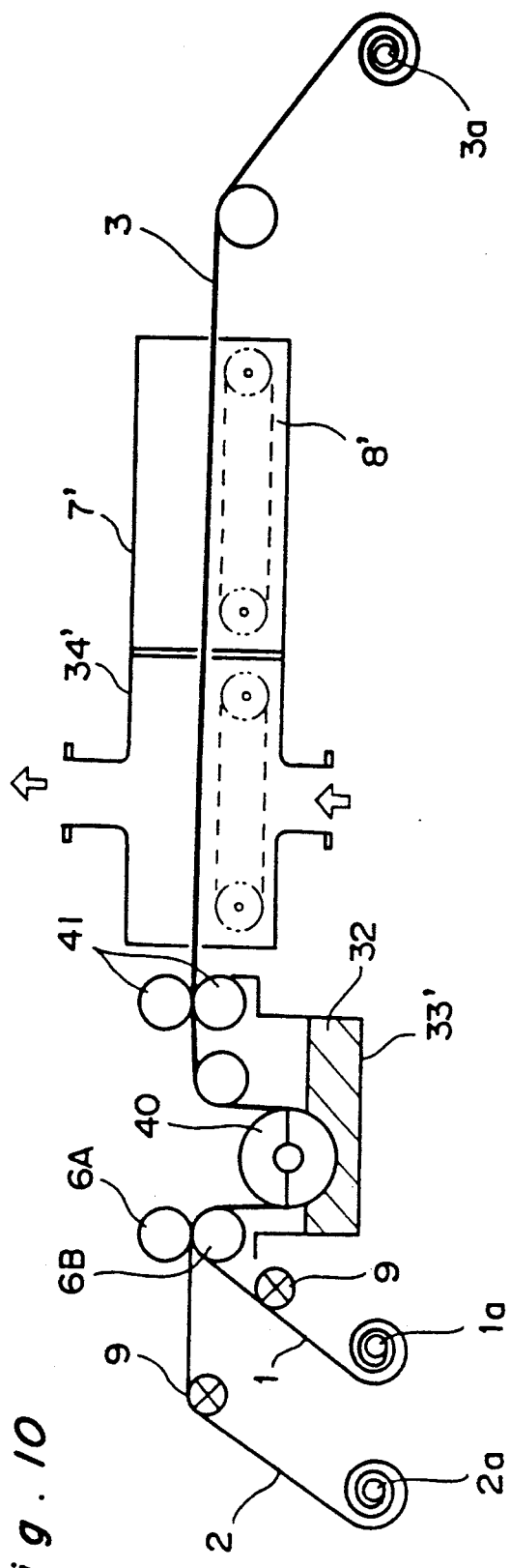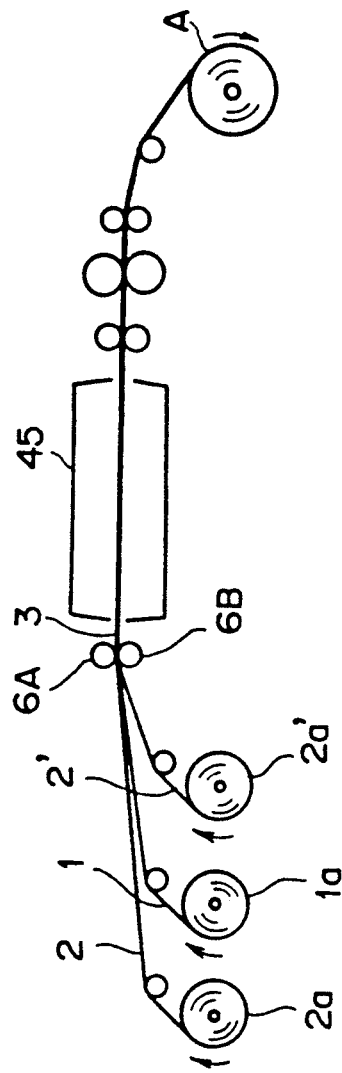

Fig. 13
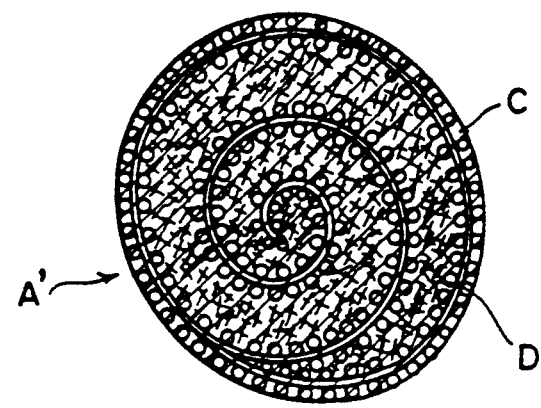
Fig. 14
Fig. 15(A)
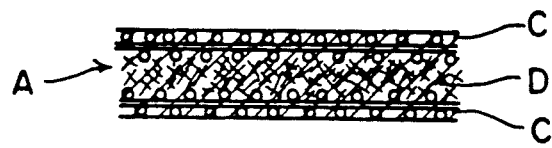
Fig. 15(B)
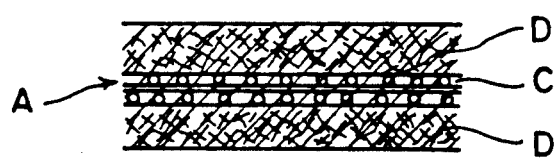
Fig. 15(C)
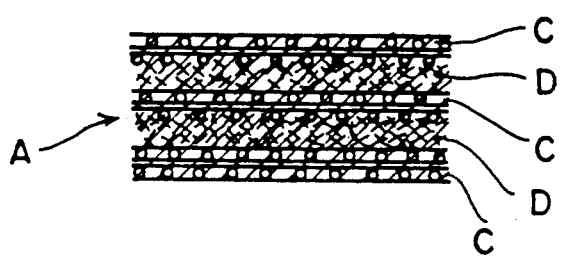

METHOD FOR MANUFACTURING A METALLIC POROUS SHEET

This application is a continuation of now abandoned application Ser. No. 07/437,437 filed on Nov. 16, 1989.

BACKGROUND OF THE INVENTION

1. Field of the invention

The present invention relates to a method for manufacturing a metallic porous sheet comprising a plurality of porous sheet layers and the metallic porous sheet manufactured by the method. It is important that the skeleton of the metallic porous sheet be unchanged and the percentage of the porous area thereof per area not be varied even though tensile force is applied thereto. The metallic porous sheet is used as electrode plates of batteries such as a nickel cadmium battery, a lithium battery, a fuel battery and the like by applying the powder of an active substance uniformly to the metallic porous sheet. Normally, the active material is successively applied to a metallic porous sheet by applying tensile force to the metallic porous sheet when an electrode plate of battery is manufactured.

2. Description of the related art

Heretofore, a plated metallic porous sheet comprising a three-dimensional net-shaped foamed sheet consisting of, for example, polyurethane sponge, a nonwoven fabric sheet or a mesh (net) has been used as the anode and cathode plates of batteries such as a nickel cadmium battery, a lithium battery, a fuel battery and the like.

In manufacturing the electrode plate of a battery using the above-described metallic porous sheet, it is required that the metallic porous sheet have a predetermined tensile strength in order to successively apply an active substance such as nickel hydroxide to the metallic porous sheet. It is necessary for the metallic porous sheet to have tensile strength of more than 3 kg/2 cm, preferably 7 kg/2 cm so that the metallic porous sheet to which tensile force is successively applied can be prevented from being extended and the skeleton thereof is unchanged to keep the percentage of the porous area thereof per area uniform even though tensile force is applied thereto.

The tensile strength of the known metallic porous sheet cannot exceed 3 kg/2 cm unless the amount of a metal deposited thereon is more than 500 g/m$^2$~600 g/m$^2$. If the amount of the metal deposited on a metallic porous foamed sheet is less than 500 g/m$^2$, openings thereof are deformed when tensile force is successively applied to a metallic porous foamed sheet and if the amount of a metal deposited on a metallic porous sheet is less than 300 g/m$^2$, any type of metallic porous sheets will be broken when tensile force is successively applied thereto. Thus, it has been impossible to successively apply tensile force to a sheet consisting of a metallic porous sheet when applying the active substance to the metallic porous sheet.

Accordingly, it is necessary to plate the metallic porous sheet as thick as 500 g/m$^2$~1,000 g/m$^2$ so that the metallic porous sheet has the required tensile strength, which means that a great amount of a metal is consumed. Hence, it a high manufacturing cost results. Further, is not easy to plate the metallic porous sheet in a uniform thickness when thickly plating the porous sheet so as to obtain the required tensile strength. When the metallic porous sheet is used as the electrode plate of a cylindrical battery, normally, the metallic porous sheet is mounted in the battery with the curvature of the curved surface thereof small. If the curvature is, for example, 3 mm, a crack is likely to occur in the metallic porous sheet in the case where a large amount of a metal is deposited thereon. In particular, openings (lattice) of a metallic porous sheet comprising a sponge are likely to become cracked or damaged. Hence, an unfavorable electrical conductivity results, which leads to the deterioration of a battery. When a swirled metallic porous sheet is mounted in a battery, needless to say, the outer portion thereof extends more than the inner portion thereof because the metallic porous sheet has a certain thickness. Thus, cracks or damage occurs in the outer portion thereof. When a swirled metallic porous nonwoven fabric sheet is mounted in a cylindrical battery, a short fiber of a metal projects therefrom. Although the metallic nonwoven fabric sheet is swirled in the cylindrical battery so as to separate the anode and cathode thereof from each other by a separator, the separator is damaged by the projection of the short fiber of the metal which is caused by the crack of the outer portion of the metallic porous nonwoven fabric, thus causing a short circuit. This is a serious drawback.

In addition, when only foamed sponge sheets or only nonwoven fabric sheets are successively transported to form a metallic porous sheet by plating a base plate, tensile force is unavoidably applied to the metallic porous sheet. The skeletons of the foamed sponge sheet and the nonwoven fabric sheet are easily deformed when tensile force is applied thereto. Consequently, the diameters of openings thereof are deformed, namely, the undesirable change of the ratio of the porous area thereof to the nonporous area. Thus, the percentage of the porous area of the metallic foamed sheet or the metallic nonwoven fabric sheet per area is changed. Therefore, the active substance cannot be applied thereto. In the case of a secondary battery, charging and discharging are repeated several hundreds of times through the electrodes. Accordingly, if the skeleton of the foamed sponge sheets and the nonwoven fabric sheets are nonuniform and the powder of the active substance is not uniformly applied to the metallic porous sheet, the electrodes is not uniformly electrified. Thus, the performance of the battery is undesirable.

SUMMARY OF THE INVENTION

The present invention has been made to solve the above-described, disadvantage and has, as its essential object, to provide a metallic porous sheet having the required tensile strength, even though the thickness of a metal deposited thereon is thin, so that the manufacturing cost thereof can be reduced.

It is another object of the present invention to provide a metallic porous sheet which does not crack when it is used as the electrode plate of a battery.

It is a still another object of the present invention to provide a metallic porous sheet in which each of porous sheet layers composing the metallic porous sheet is not easily deformed, the skeletons thereof are not varied, and the percentage of the porous area thereof per area is uniform so that the electrical conductivity of the battery is uniform when it is used as the electrode plate thereof.

According to a preferred embodiment of the present invention, there is provided a method for manufacturing metallic porous sheets by plating these sheets. The sheets include a sheet comprising a foamed sheet and a mesh sheet layered with each other, in which the mesh sheet is not easily deformed compared with the foamed sheet and has a strong tensile force; a sheet comprising a mesh sheet and a nonwoven fabric sheet layered with each other; a sheet comprising a mesh sheet, nonwoven fabric sheet, and a foamed sheet layered with each other; and a sheet comprising a nonwoven fabric sheet and a foamed sheet layered with each other.

It is preferred that the respective porous sheets are adhered to each other by melting or with an adhesive before they are plated, but they are not necessarily adhered to each other. And they are plated after they are layered with each other.

Each of the above-described porous sheets includes a plurality of sheets formed by laminating a desired number of porous sheets of different kinds, for example, three or four layers and arranging them in a desired order.

A plurality of the porous sheets is then plated by any one of the following methods: vacuum evaporation, namely, where the layered porous sheets are successively transported to a vacuum container in which a metal is vapor-deposited thereon; a method for making the layered porous sheet conductive while it is being successively transported and then, transporting it to a plating tank in which a plating liquid is applied thereto in a direction approximately perpendicular thereto; an electroless plating method; an electrolytic plating method; method and a method for electrolytically plating the layered sheets after making them conductive by means of the vacuum evaporation method and the electroless plating method.

A metallic porous sheet manufactured in accordance with the present invention consisting of a metallic foamed sheet layer, a metallic mesh sheet layer and a metallic nonwoven fabric sheet layer is preferably used as the plate of a battery.

The foamed sheet consists of, for example, a polyurethane sponge or the like and its thickness preferably ranges from 0.5 mm to 5.0 mm and its diameter preferably ranges from 50 $\mu$m to 500 $\mu$m. A mesh sheet and a nonwoven fabric sheet are selected from the following materials: synthetic resins such as polyester, polypropylene, polyurethane; organic substances such as natural fiber, cellulose, paper; inorganic substances such as metals, glasses, carbon. The threads of each of these materials is composed by braiding a net-shaped or a plurality of fibers. The diameter of one thread preferably ranges from 0.01 mm to 1.0 mm and the percentage of the porous area of the mesh sheet or the nonwoven fabric sheet favorably ranges from 40 to 99. The mesh sheet of ranging from 2 to 200-mesh is preferably used.

The metal to be used to plate the layered sheet by vacuum evaporation is selected from Cu, Ni, Zn, Sn, Pd, Pb, Co, Al, Mo, Ti, Fe, SUS304, SUS430, 30Cr, Bs, and the like. The metal to be used in the electroless plating is selected from Cu, Ni, Co, Pd, Sn, Zn and the like. The metal to be used in the electrolytic plating is selected Cu, Ni, Co, Pd, Sn, Zn, Pb, Fe, and the like.

When the porous sheet such as the foamed sheet, the mesh sheet, and the nonwoven fabric sheet are adhered by melting to each other, a porous sheet, whose melting point is lower than that of the adjacent sheets is heated up to its melting point at the surface thereof to be adhered. A porous sheet is heated at the following temperatures according to a material composing the porous sheet:

| | |
|---|---|
| polyester | 255~260° C. |
| nylon | 250~260° C. |
| acrylic | 210~260° C. |
| polypropylene | 165~173° C. |
| polyethylene | 125~230° C. |
| polyurethane | 200~230° C. |
| rayon | 200~230° C. |

According to the method for manufacturing a metallic porous sheet, a mesh sheet susceptible to a deformation is layered with and adhered to a foamed sheet and a nonwoven fabric sheet susceptible to a deformation when tensile force is applied thereto, so that the tensile strength of a sheet formed by layering these sheets with each other is great, and thereafter, the layered sheet is plated to form a metallic porous sheet. Accordingly, the sheet can be prevented from being deformed during a plating process even though tensile force is continuously applied thereto. The tensile strength of the metallic porous sheet consisting of a metallic foamed sheet layer, a metallic mesh sheet layer, and a metallic nonwoven fabric sheet layer is great because of the existence of the metallic mesh sheet or because the metallic mesh sheet is layered with the foamed sheet and the nonwoven fabric sheet. According to the known methods, the tensile strength of a metallic porous sheet is more than 3 kg/2 cm unless a metal of 500 g/m$^2$~600 g/m$^2$ is deposited on a corresponding layered porous sheet, whereas according to the present invention, the metallic porous sheet has the necessary tensile strength (more than 3 kg/2 cm) even though the amount of a metal deposited on the layered sheet is less than 300 g/m$^2$. Hence, a remarkable reduction of the manufacturing cost can be obtained.

Further, when an electrode plate of battery is manufactured by applying an active substance to a metallic porous sheet formed according to the method of the present invention, the active substance can be applied to the metallic porous sheet while the tensile force is successively applied thereto without deforming the skeleton thereof and with the percentage of the porous area thereof per area kept unchanged. Thus, electricity flows uniformly throughout through the metallic porous sheet, or the electrode of the battery, which contributes to a favorable performance of the battery.

Furthermore, the metallic porous sheet can be prevented from being cracked or deformed when it is bent in a very small curvature so as to be mounted in a cylindrical battery. This is because the metallic mesh sheet reinforces the metallic porous sheet and a small amount of the metal is deposited on the metallic porous sheet. When the metallic porous sheet is swirled to be mounted in the battery, the metallic formed sheet or the metallic nonwoven fabric sheet is disposed in the inner portion of the battery and the metallic mesh sheet is disposed in the outer portion thereof, in consideration of the fact that, the outer portion is more likely to be extended than the inner portion. Thus, cracks or damage do not occur and the electrical conductivity of the electrode of the battery is superb. This construction prevents short fibers of a metal from projecting from the metallic porous sheet, thus preventing a separator from being damaged.

BRIEF DESCRIPTION OF THE INVENTION

These and other objects and features of the present invention will become apparent from the following description taken in conjunction with the preferred embodiments thereof with reference to the accompanying drawings, in which.

Figure 7A:
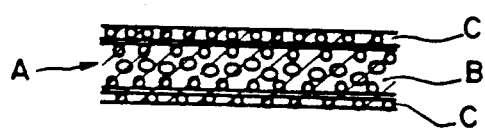
Figure 7B:
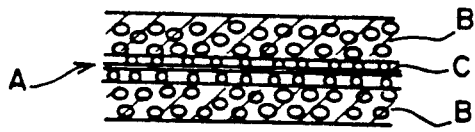
Figure 7C:
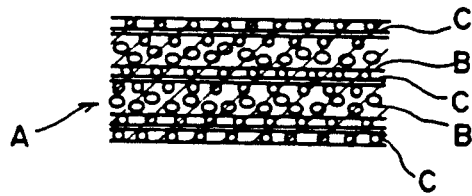
Figure 8:
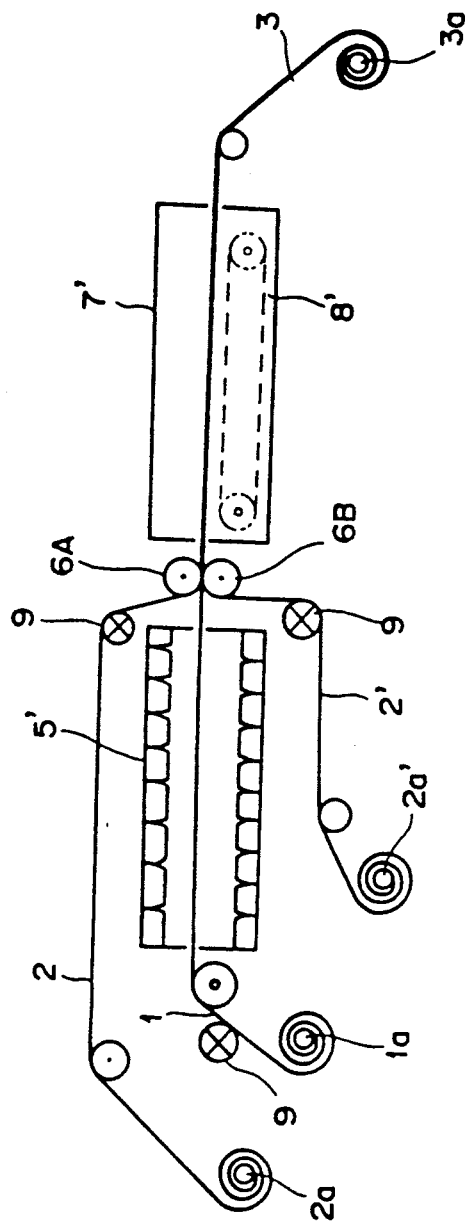
Figure 9:
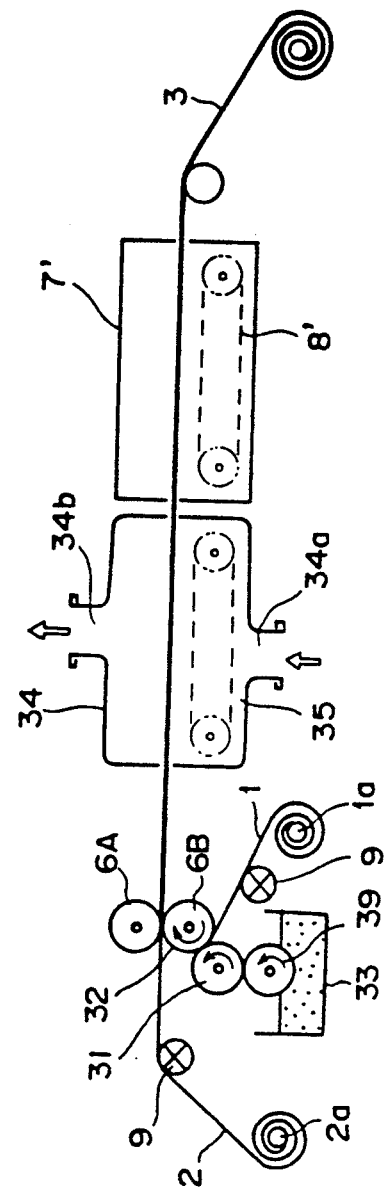
Figure 12:
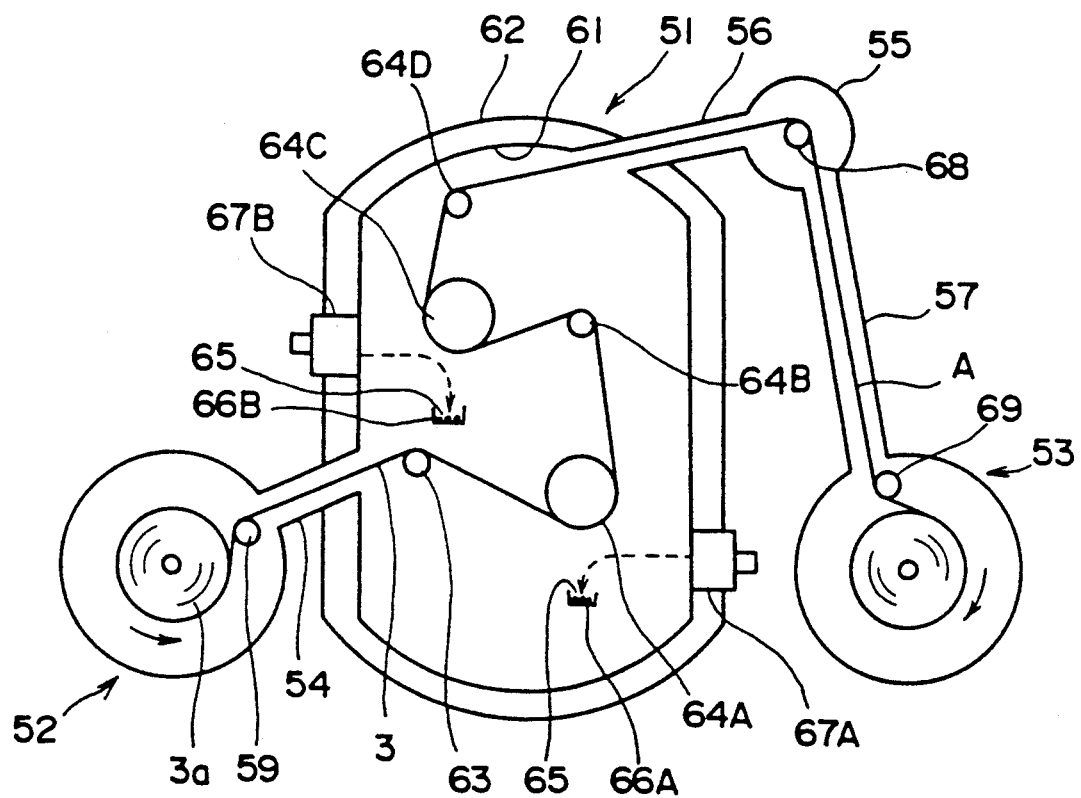
Figure 16:
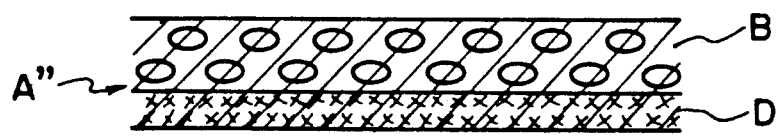
Figure 17:
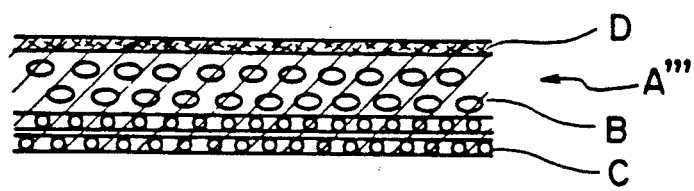
Figure 18A:
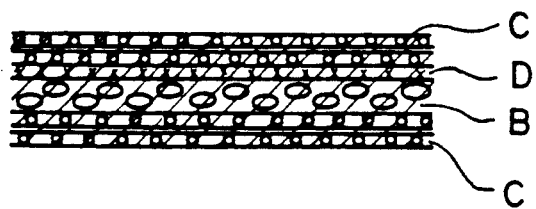
Figure 19:
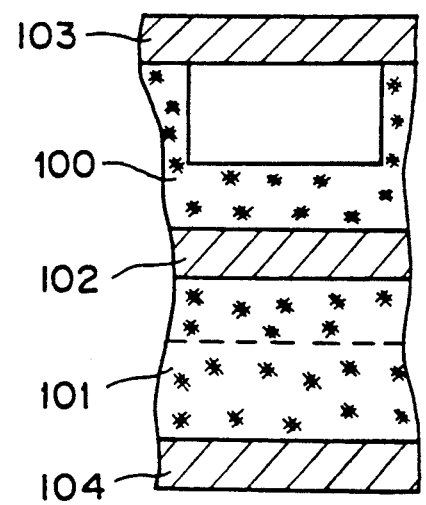
Figure 18B:
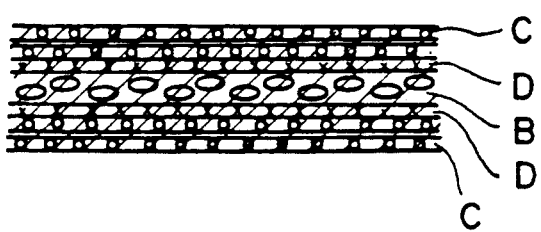

FIGS. 7A, 7B, and 7C are sectional views showing a second through a fourth embodiment of a metallic porous sheet formed by layering a metallic foamed sheet and a metallic mesh sheet with each other;

FIG. 8 is a schematic diagram showing a process for forming a three-layer layered sheet shown in FIG. 7A;

FIG. 9 is a schematic diagram showing a process, for forming a layered sheet by adhering porous sheets with adhesive to each other, to be performed in a fifth embodiment of the present invention;

FIG. 10 is a schematic diagram showing a process, for forming a layered sheet by adhering porous sheets with adhesive to each other by a method other than the method employed in the fifth embodiment, to be performed in a sixth embodiment of the present invention;

FIG. 11 is a schematic diagram showing a process for plating layered sheets without adhering them to each other beforehand to be carried out in a seventh embodiment;

FIG. 12 is a schematic diagram showing a vacuum evaporation plating apparatus employed to plate a layered sheet to be carried out in an eighth embodiment;

FIG. 13 is a sectional view showing a ninth embodiment in which a metallic porous sheet is formed by layering a metallic nonwoven fabric sheet and a metallic mesh sheet with each other;

FIG. 14 is a sectional view showing a ninth embodiment in which a metallic porous sheet is swirled to be applied as the electrode of a battery;

FIGS. 15A, 15B, and 15C are sectional views showing tenth, eleventh, and twelfth embodiments in which a metallic nonwoven fabric sheet and a metallic mesh sheet are layered with each other;

FIG. 16 is a sectional view showing a thirteenth embodiment in which a metallic porous sheet is formed by layering a metallic foamed sheet and a metallic nonwoven fabric sheet with each other;

FIG. 17 is a sectional view showing a fourteenth embodiment in which a metallic porous sheet is formed by layering a metallic foamed sheet, a metallic nonwoven fabric sheet, and a metallic mesh sheet with each other;

FIGS. 18A and 18B are sectional views showing fifteenth and sixteenth embodiments in which a plurality of metallic foamed sheets, metallic nonwoven fabric sheets, and metallic mesh sheets are layered with each other; and FIG. 19 is a schematic sectional view showing the principal portions of a fuel battery.

DETAILED DESCRIPTION OF THE INVENTION

Before the description of the present invention proceeds, it is to be noted that like parts are designated by like reference numerals throughout the accompany drawings.

FIGS. 1 through 5 show a first embodiment of the present invention. According to the first embodiment, a sheet 3 comprising a foamed sheet 1 consisting of a polyurethane sponge and a mesh sheet 2 adhered to each other by a melting is successively transported to a metal plating tank 4 in which a plating liquid is forcibly applied to the sheet 3 (hereinafter referred to as the layered sheet) in a direction perpendicular thereto. Thus, a metallic porous sheet comprising a plurality of porous sheets is manufactured. The method for manufacturing the metallic porous sheet is described below.

Figure 1:
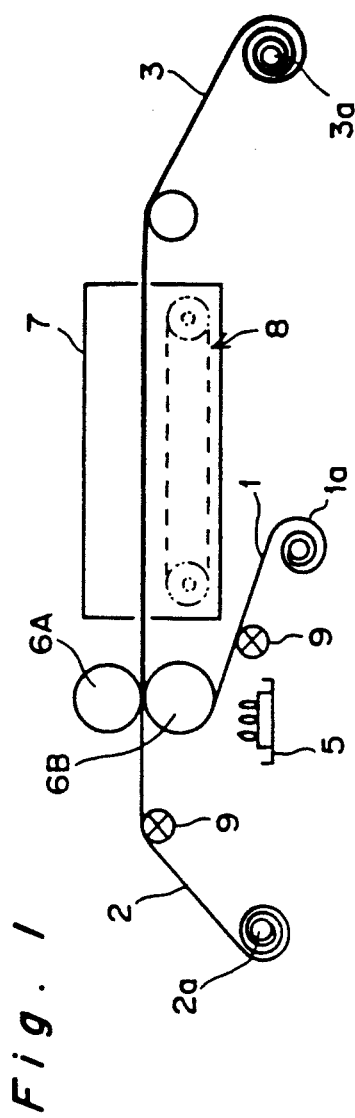
FIG. 1 is a schematic diagram showing the method for adhering sheets by melting in a first embodiment.

FIG. 1 shows a process for forming the layered sheet 3 by adhering the foamed sheet 1 and the mesh sheet 2 with each other by melting the one surface of foamed sheet 1.

The thickness of the foamed sheet 1 to be used in the present invention ranges from 0.5 mm to 5.0 mm and the diameter of each of the openings thereof is in the range from 50 $\mu$m to 500 $\mu$m and preferably, from 200 $\mu$m through 350 $\mu$m. The thickness of the foamed sheet 1 to be used in the first embodiment is 1.7 mm.

The diameter of each of the threads of the mesh sheet 2 ranges from 0.01 mm to 1.0 mm and preferably, from 0.05 mm to 0.1 mm. The mesh size of the mesh sheet 2 ranges from 2-mesh to 200-mesh and preferably, from 40-mesh to 120-mesh. Preferably, the percentage of the porous area ranges from 40 to 99. In this embodiment, the diameter of each of the threads of the mesh sheet 2 is 0.07 mm and the mesh size of the mesh sheet 2 is 60-mesh.

In this embodiment, the mesh sheet 2 consists of polyester, however, it may consist of any one of the following substances: A synthetic resin such as nylon, acrylic, polypropylene, rayon and the like; an organic substance such as natural fiber, cellulose, paper and the like; and an inorganic substance such as a metal, glass, carbon and the like. The configuration of the mesh sheet 2 consists of a net with meshes braided with warps and wefts or is formed by braiding one or a plurality of net-shaped or fiber-shaped threads. The sectional configuration of a mesh is either round or polygonal or flat.

As shown in FIG. 1, the coiled foamed sheet 1 (1a) and mesh sheet 2 (2a) coiled around a corresponding roller are successively fed toward a corresponding expander roller 9, respectively. The one side surface of foamed sheet 1, the melting point of which is lower than that of the mesh sheet 2 is heated by a heating device 5. Then, the foamed sheet 1 is superimposed on the mesh sheet 2 when both sheets 1 and 2 arrive at a pair of pressure applying rollers 6a and 6b which serve as a means for adhering the mesh sheet 2 to the melted surface of foamed sheet 1. Thereafter, the layered sheet 3 is introduced into a cooling chamber 7 in which a cold air is being circulated. The layered sheet 3 is supported by a metallic mesh conveyor belt 8 so that the layered sheet 3 is transported through the cooling chamber 7. The foamed sheet 1 and the mesh sheet 2 integrated with each other is taken out of the cooling chamber 7 as the layered sheet 3. Thereafter, the layered sheet 3 is coiled around a roller as shown by 3a in FIG. 1. The expander rollers 9 serve as means for smoothing the wrinkles from the foamed sheet 1 and the mesh sheet 2 which have been fed from the respective rollers.

In the first embodiment, the heating device 5 comprising a burner as shown in FIG. 1 applies flame directly to the surface of the foamed sheet 1 consisting of the urethane sponge. Propane, butane or the like, used as the fuel of the burner, melts the surface of foamed sheet 1 on the side thereof to be adhered to the mesh sheet 2. The amount of the foamed sheet 1 to be melted is determined by adjusting the height of the flame of the burner. That is, needless to say, if the amount of the flame of the burner is small, i.e., if the distance between the top of the flame and the surface of the foamed sheet 1 is large, the foamed sheet 1 is melted in a small degree. In this case, the foamed sheet 1 cannot be firmly adhered to the mesh sheet 2. On the other hand, if the amount of the flame of the burner is large, the foamed sheet 1 is melted in a large degree. In this case, the foamed sheet 1 can be firmly adhered to the mesh sheet 2. Supposing that the surface of the foamed sheet, namely, the urethane sponge is melted in the thickness of 0.2 mm, the adhesive strength thereof is 50 g/25 mm whereas when the urethane sponge is melted in the thickness of 0.5 mm, the adhesive strength thereof is 100 g/25 mm.

Figure 6:
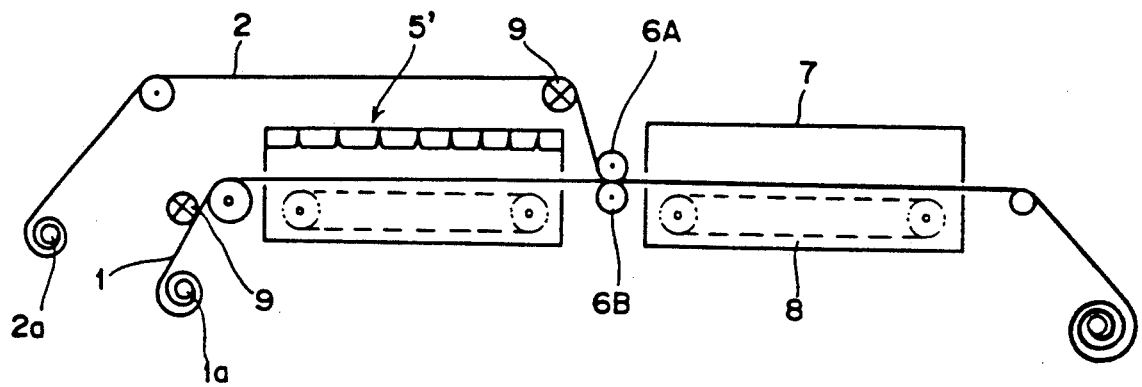
FIG. 6 is a schematic diagram showing another method for adhering melting sheets to each other.

As shown in FIG. 6, instead of the burner, an ultra-far infrared heating device 5' may be employed to heat the surface of the foamed sheet 1 to be adhered to the mesh sheet 2 in a manner similar to that described referring to FIG. 1. The ultra-far infrared heating device 5' reliably melts only the surface of the thin foamed sheet 1 which is adhered to the mesh sheet 2. In addition, a heater or hot air may be preferably used as the heating means.

Figure 2:
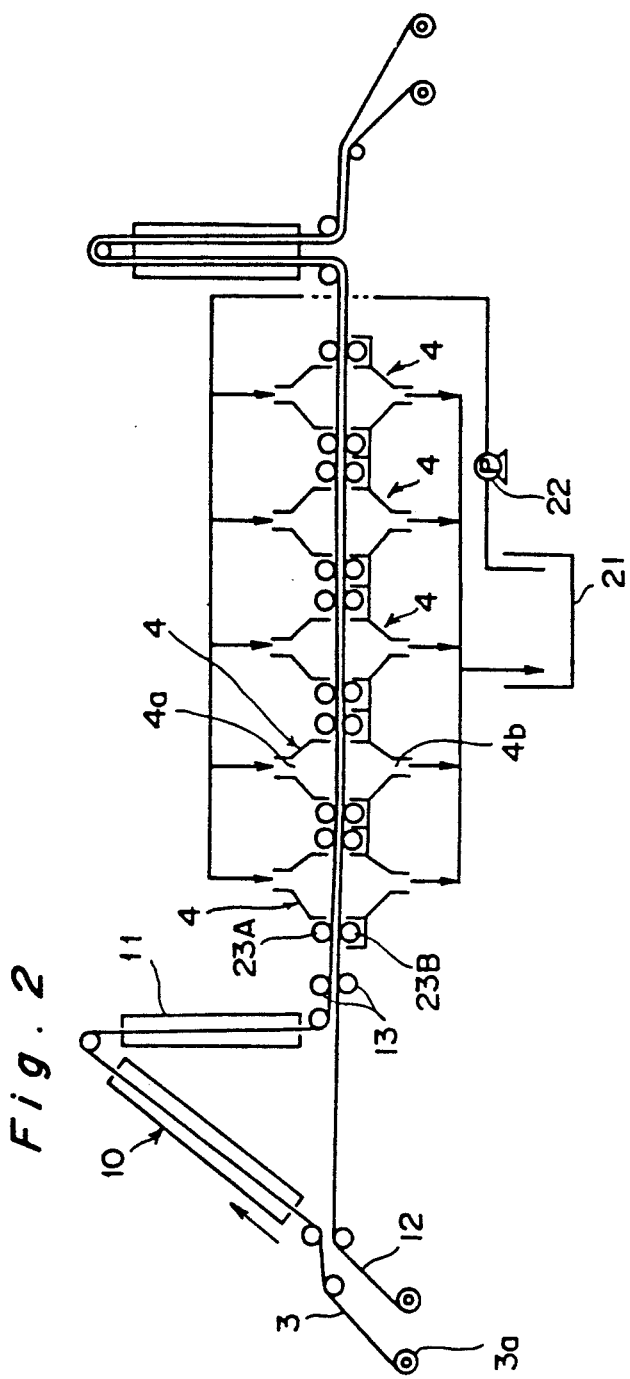
FIG. 2 shows a plating method to be carried out in the first embodiment.
Figure 3:
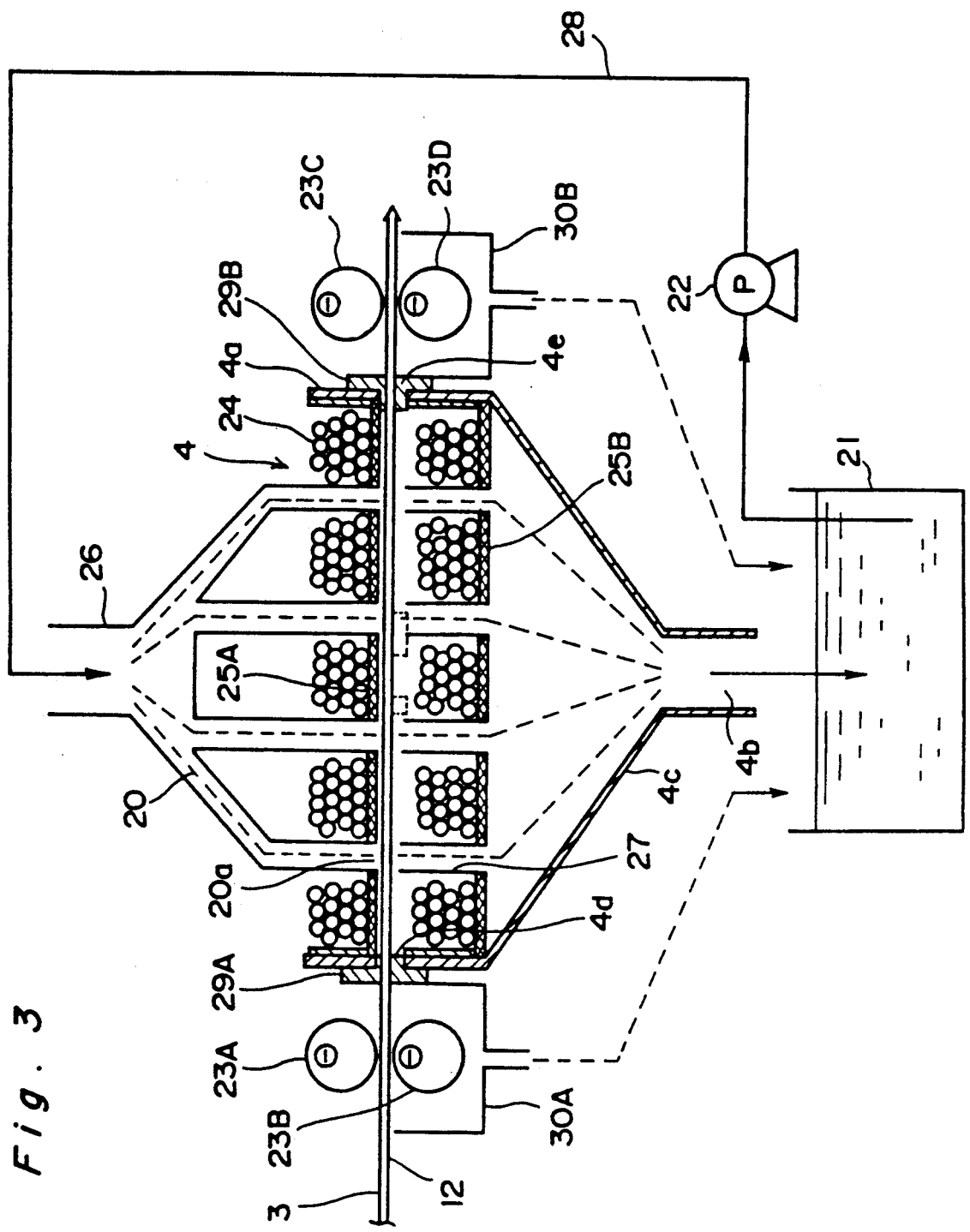
FIG. 3 is a sectional view showing in detail the plating apparatus shown in FIG. 2.

As described above, the layered sheet 3 comprising the foamed sheet 1 and the mesh sheet 2 adhered to each other by melting the foamed sheet 1 is plated with nickel (Ni) by a plating apparatus as shown in FIGS. 2 and 3. Thus, a metallic porous sheet comprising a metallic foamed sheet and a metallic mesh sheet is formed.

In this embodiment, as shown in FIG. 1, the layered sheet 3 coiled around the roller is transported to the plating apparatus. Instead, the layered sheet 3 may be fed directly to the plating apparatus without coiling the layered sheet 3 around the roller.

In the apparatuses shown in FIGS. 2 and 3, the layered sheet 3 coiled as shown by reference numeral 3a in FIG. 2 is fed to the electricity applying device 10 which electrifies the layered sheet 3, then, dried by a hot air drying device 11. Thereafter, the layered sheet 3 is placed on a mesh-net conveyor 12 through a roller 13. The tensile strength of the layered sheet 3 is great because the layered sheet 3 includes the mesh sheet 2. Therefore, the mesh-net conveyor 12 is not necessarily provided in the plating apparatus for the layered sheet 3 to pass through the plating apparatus.

The layered sheet 3 is nickel plated five times by the first plating tank 4 through the fifth plating tank 4 while the layered sheet 3 is being transported through the plating apparatus 4. As a result, the layered sheet 3 is plated in the thickness of 300 g/m$^2$.

A plating apparatus shown in FIG. 3 comprises plating liquid supply nozzles (hereinafter referred to as nozzle) 20 for supplying plating liquid to a plating tank 4 downward, a plating liquid storing tank 21 disposed in the lower portion thereof, a forced transporting pump 22 which communicates with nozzle 20 and the plating liquid storing tank 21 through a plating liquid supply pipe 28. The porous layered sheet 3 which has been introduced successively into the plating tank 4 passes below the nozzle 20. The plating apparatus further comprises conductor rollers 23A and 23 disposed forward of the layered sheet introducing side. The conductor rollers 23A and 23B negatively charge the layered sheet 3 in contact therewith. The plating tank 4 includes cases 25A and 25B accommodating anode balls 24.

The detailed description of the construction of the plating tank 4 is made below. The plating tank 4 rectangular in a sectional view comprises upper side walls 4a having no covers; lower walls 4c tapered toward the lower center opening 4b; an introducing opening 4d, for introducing the layered sheet 3, mounted on one side of the upper side wall 4a; and a discharge opening 4e, for discharging the plated sheet 3, mounted on the other side of the upper side wall 4a.

The conductor rollers 23A, 23B disposed outside the openings 4d and 23C, 23D disposed outside the openings 4e are connected to the cathode. The layered sheet 3 and the supporting conveyor 12 are introduced from the pair of the conductor rollers 23A and 23B into the plating tank 4 and discharged from the pair of the conductor rollers 23C and 23D. When the layered sheet 3 and the supporting conveyer 12 contact with the pair of the conductors 23A, 23B and 23C, 23D, the layered sheet 3 is negatively charged.

The plating tank 4 includes a plurality of pair of anode cases (hereinafter referred to as cases) 25A and 25B vertically disposed so that the layered sheet 3 and the conveyor 12 move forward between the upper cases 25A and the lower cases 25B. The bottom faces of the cases 25A and 25B are composed of laths. The outer frames thereof are removably mounted in the plating tank 4. The cases 25A and 25B are connected to the anode so as to positively charge the balls 24 provided therein.

Not only the round balls 24, but also plate-shaped or rectangular balls may be used unless they allow the plating liquid to pass therethrough and to be applied to the layered sheet 3 approximately perpendicularly thereto. But when plate-shaped or rectangular balls are used, the direction in which the plating liquid drops is unfavorable compared with the use of the round balls 24. That is, ions are not effectively supplied to the layered sheet 3 when plate-shaped or rectangular metals are used.

Nozzles 20 branched from a main supply pipe 26 disposed on the upper portion of the plating tank 4 are perpendicular to the layered sheet 3 and interposed between the respective cases 25A. The outlet 20a of the lower end portion of the nozzles 20 is inserted into an opening formed on the bottom face of the case 25A. The plating liquid is jetted out of the outlet 20a disposed in the vicinity of the surface of the layered sheet 3 and the plating liquid is applied to the layered sheet 3. A plating liquid receiving pipe 27 is mounted on the case 25B so that the pipe 27 vertically coincides with the plating liquid supply nozzle 20 with the pipe 27 disposed downward of the layered sheet 3 and the nozzle 20 disposed upward thereof.

In FIG. 3, although four nozzles 20 are spaced at regular intervals in the direction in which the layered sheet 3 travels, the number of nozzles 20 is not limited to four. But it is necessary to provide the plating apparatus with the nozzles 20 so that the plating liquid jetted out of the outlet 20a is applied entirely to the layered sheet 3. The plating liquid is supplied from the plating liquid storing tank 21 by the forced feeding pump 22 through the supply tube 28. The plating liquid jetted out of the outlet 20a and discharged from the opening 4b disposed at the lower end of the plating tank 4 is collected by the plating liquid storing tank 21. The plating liquid is moved upward through the pipe 28 and introduced into the main supply pipe 26, thus falling downward in the plating tank 4 at a predetermined speed. Thus, the plating liquid is circulated. The flow rate of the plating liquid ranges from 50 to 300 m/min and preferably, in the range from 100 to 200 m/min.

Sealing means 29A and 29B are mounted on the introducing opening 4d and the discharge opening 4e, respectively so as to prevent the plating liquid from leaking from the introducing and discharge portions of the plating tank 4. Moreover, plating liquid receiving tanks 30A and 30B are mounted below the conductor rollers 23B and 23D, respectively.

The operation of the plating apparatus is described below. The layered sheet 3 is negatively charged in contact with the conductor rollers 23A and 23B. The layered sheet 3 is introduced into the plating tank 4 in this condition. The plating liquid which has been brought in contact with the anode balls 24 is applied to the negatively charged layered sheet 3 at right angles therewith. Then, the plating liquid passes through the openings (openings of the foamed sheet 1 and the mesh sheet 2) of the layered sheet 3 at the predetermined speed. Thus, metallic ions are uniformly supplied into the layered sheet 3, with the result that nickel is uniformly electrolytically deposited on both surfaces of the layered sheet 3 and the surface of inside openings thereof. Metals such as Cu, Ni, Cr, Cd, Zn, Sn which can be electroplated can be electrolytically deposited on the layered sheet 3. In this embodiment, as described above, nickel is used.

In the above-described plating process, when the plating liquid flows at a high speed, electric current efficiency can be improved. Thus, the layered sheet 3 can be plated at a high electric current density. The layered sheet 3 can be plated at a high electric current density from the first time plating and the grain size of the metal electrolytically deposited on the layered sheet 3 is very fine. Therefore, the strength of the grain boundary of the metal deposited on the layered sheet 3 is great and the metal can be favorably deposited on the layered sheet 3. According to the present invention, electric current density can be selected in the range as wide as $10\sim600$ A/dm$^2$, preferably, in the range from $100\sim400$ A/dm$^2$.

Since the mesh sheet 2 which is great in tensile strength and not easily extended is adhered to the foamed sheet 1, the layered sheet 3 can be plated in a stable condition with the layered sheet 3 moving in the plating apparatus compared with the case in which the foamed sheet 1 alone is plated. Accordingly, the configurations of the openings of the foamed sheet 1 can be prevented from being varied and the surface of the porous sheet thus formed is not irregular or curved. In addition, the thickness of the plating is uniform throughout the layered sheets 3.

The layered sheet 3 is uniformly plated not only externally, namely, in both surfaces of the sheet 3, but also in the surface of internal openings thereof. Therefore, when the metallic porous sheet formed according to the above-described method is coiled around a roller, there is no directionality in the metallic porous sheet. In particular, when it is coiled in a small curvature, a crack does not occur in the metallic porous sheet. Further, since the configuration of the layered sheet 3 is not varied, namely, flat, the metallic porous sheet can be reliably used in a coiled condition.

After the metal is electrolytically deposited on the layered sheet 3 in a predetermined thickness (300 g/m$^2$ in this embodiment), the plated sheet is washed in water and dried by a hot air. Since the mesh sheet is adhered to the foamed sheet, the plated sheet can be prevented from being deformed when it is washed in water.

After the plated sheet is dried, it is heated by a burn off device (not shown) at 400° C.$\sim$1,000° C., preferably 700° C.$\sim$800° C. Thereafter, a sintering and a reduction re performed in a reducing atmosphere at approximately 700° C.$\sim$1,100° C. The deformation correction, namely, the annealing of the electrolytically deposited metal layer are effected by the sintering process as well when the sintering is carried out.

The metallic porous sheet, consisting of the metallic foamed sheet layer and the metallic mesh sheet layer, completed by the burn off and the sintering after the layered sheet 3 is plated, has a tensile strength of 7.2 kg/2 cm when the amount of the metal which has deposited on the layered sheet 3 is 300 g/m$^2$.

Figure 4:
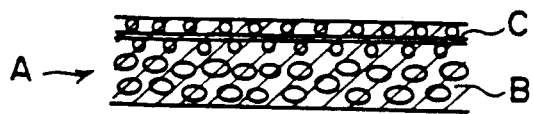
FIG. 4 is a sectional view showing a metallic porous sheet formed by the method to be performed in the first embodiment.

The construction of the metallic porous sheet (A) manufactured by the method according to the first embodiment is as shown in FIG. 4. That is, the metallic porous sheet (A) consists of the metallic foamed sheet layer (B) and the metallic mesh sheet layer C. Even though tensile force is applied to the layered sheet 3 in the plating process, the deformation of the skeleton of the foamed sheet can be prevented, i.e., the skeleton of the foamed sheet remains unchanged because the mesh sheet is adhered to the foamed sheet. Accordingly, the percentage of the porosity area of the foamed sheet per area is uniform.

When the metallic porous sheet A having the above-described construction is used as the electrode plate of a battery, it is necessary for the metallic porous sheet A to have a tensile strength of more than 3 kg/2 cm, preferably more than 7 kg/2 cm because the powder of an active substance such as nickel hydroxide is applied to the metallic porous sheet (A). Since the metallic porous sheet (A) has the tensile strength of 7 kg/2 cm, the powder of the active substance can be charged in the metallic porous sheet, while tensile force is successively applied to the metallic porous sheet (A).

Figure 5:
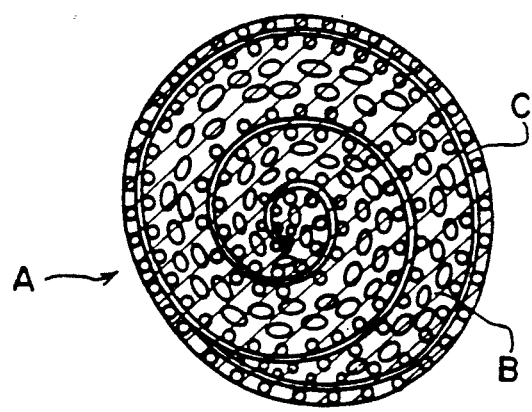
FIG. 5 is a sectional view showing a swirled metallic porous sheet so as to be used as an electrode plate of a battery.

When the metallic porous sheet (A) is swirled as shown in FIG. 5 so as to be used as the electrode plate of a battery to which the powder of the active substance is applied, a crack is not likely to occur because the metallic porous sheet (A) has a small amount of the metal, i.e., because the metal has not thickly deposited on the layered sheet 3. Further, since the metallic mesh sheet layer reinforces the metallic porous sheet (A) when it is bent, a crack or damage is unlikely to occur. The construction of the metallic porous sheet (A), as shown in FIG. 5, in which the metallic mesh sheet layer (C) is disposed externally and the metallic foamed sheet layer (B) is disposed internally does not allow a crack or damage to occur.

In the first embodiment, the metallic porous sheet (A) consists of the metallic foamed sheet layer (B) and the metallic mesh sheet layer (C). But as shown in FIG. 7A through 7C, a metallic porous sheet can be constructed by selecting a desired number of metallic foamed sheet layers and the metallic mesh sheet layers and arranging these two sheet layers in a desired order.

FIG. 7A shows a second embodiment showing a three-layer metallic porous sheet consisting of the metallic mesh layers (C) layered on both sides of the metallic foamed sheet layer (B). FIG. 7B shows a third embodiment showing a three-layer metallic porous sheet consisting of the metallic foamed sheet layer (B) layered on both sides of the metallic mesh sheet layer (C). FIG. 7B shows a fourth embodiment showing a five-layer metallic porous sheet consisting of the metallic mesh sheet layer (C), the metallic foamed sheet layer (B), the metallic mesh sheet layer (C), the metallic foamed sheet layer (B), and the metallic mesh sheet layer (C) arranged in this order.

The number of sheets to be layered and the arrangement of metallic porous sheets are determined according to use. The three-layer metallic porous sheet consisting of the metallic mesh layers (C) disposed on both sides of the metallic foamed sheet layer (B) has a favorable conductivity when this metallic porous sheet is used as the electrode plate of a battery.

Similarly to the first embodiment, when more than two porous sheets are adhered to each other, the surface of a porous sheet whose melting point is the lower of two porous sheets is heated to be melted, and the porous sheet whose melting point is the higher of the two porous sheets is adhered under pressure to the sheet whose melting point is the lower of the two porous sheets. The same method is carried out to adhere other metallic porous sheets to each other.

When the metallic porous sheet of the second embodiment shown in FIG. 7A is manufactured, as shown in FIG. 8, sheets are moved forward from the coil 2a of a mesh sheet 2, the coil 1a of a foamed sheet 1, and the coil 2a' of a mesh sheet 2', respectively. Before the three sheets 2, 1, and 2' are adhered to each other by the pressure applying rollers 6A and 6B, both surfaces of the foamed sheet 1 disposed between the mesh sheets 2 and 2' is heated and melted by a ultra-far infrared heating device 5'. Then, the mesh sheets 2 and 2' are adhered to both surfaces of the foamed sheet 1 when pressure is applied to the sheets 2, 1, and 2' by the pressure applying roller 6A and 6B.

FIG. 9 shows the fifth embodiment of the present invention showing the method for forming the layered sheet 3 by adhering the foamed sheet 1 and the mesh sheet 2 to each other with an adhesive. That is, before the foamed sheet 1 and the mesh sheet 2 are layered with each other by the rollers 6A and 6B, an adhesive 32 is applied to the surface of the foamed sheet 1 by an adhesive applying roller 31. The adhesive applying roller 31 is in contact with a roller 39 soaked in an adhesive storing tank 33. Therefore, a predetermined amount of the adhesive 32 is transferred to the surface of the adhesive applying roller 39. With the rotation of the adhesive applying roller 31 in contact with the surface of the foamed sheet 1 under pressure, the adhesive 32 is uniformly applied to the surface of the foamed sheet 1.

According to the apparatus in which a plurality of rollers are used, an extra amount of the adhesive can be prevented from being taken out of the adhesive storing tank 33 and the adhesive is uniformly applied to the surface of the foamed sheet 1.

The foamed sheet 1 and the mesh sheet 2 adhered to each other through the adhesive 32 are introduced into a drying chamber 34. Hot air is supplied to the drying chamber 34 from an inlet 34a and the layered sheet 3 being transported by a metallic mesh conveyor 35 is dried by the hot air which is then discharged from an outlet 34b.

After the layered sheet 3 is dried in the drying chamber 34, it is introduced into a cooling chamber 7'. The layered sheet 3 is cooled while it is being transported by a mesh conveyor 8'. Before the layered sheet 3 is discharged from the cooling chamber 7', the foamed sheet 1 and the mesh sheet 2 are reliably adhered to each other with the adhesive 32.

FIG. 10 shows the sixth embodiment showing a method for adhering the foamed sheet 1 and the mesh sheet 2 to each other with adhesive. According to this method, the foamed sheet 1 and the mesh sheet 2 are layered with each other by the rollers 6A and 6B. Then, with the rotation of a roller 40 disposed an adhesive storing tank 33', the layered sheet 3 moves forward, and then, is impregnated in an adhesive 32. Thus, the foamed sheet 1 and the mesh sheet 2 are adhered to each other. Thereafter, an extra amount of the adhesive 32 is removed by a squeezing roller 41. The layered sheet 3 comprising the foamed sheet 1 and the mesh sheet 2 adhered to each other by the adhesive 32 is also dried in the drying chamber 34', then cooled in the cooling chamber 7'.

FIG. 11 shows the seventh embodiment of the present invention. In the above-described embodiments, the layered sheet 3 is formed by adhering the foamed sheet 1 and the mesh sheet 2 to each other by melting the foamed sheet 1 or with an adhesive before the layered sheet 3 is plated. In this embodiment, however, the foamed sheet 1 and the mesh sheet 2 are layered in close contact with each other, i.e., both sheets 1 and 2 are not adhered to each other by melting or with the adhesive, and then, transported to a plating apparatus. In the plating process, a metal is deposited on the layered sheet 3 and at the same time, the sheets 1 and 2 are adhered to each other. More specifically, the mesh sheet 2, the foamed sheet 1, and the mesh sheet 2' are fed from coils 2a, 1a, and 2a', respectively and pressure is applied to the sheets 2, 1, and 2'. Then, the sheet 3 comprising the sheets 2, 1, and 2' layered with each other by the pressure applying rollers 6A and 6B is transported to a plating apparatus 45. According to this method, even though tensile force is applied to the layered sheet 3, the foamed sheet 1 is not deformed even though the foamed sheet 1 is not adhered to the mesh sheet 2. This is because the foamed sheet 1 is sandwiched between the mesh sheets 2 and 2' which is not susceptible to tensile force.

FIG. 12 shows the eighth embodiment showing a method for plating by vacuum deposition, on the surface of the layered sheet 3 comprising a plurality of sheets adhered to each other either by a melting or with an adhesive or layered with each other under pressure without melting or adhesive.

Conventionally, the method for plating by vacuum vapor deposition is used to form a thin film, and a metal is vapor-deposited on the film in the thickness ranging from 0.1 to less than 1.0μ. When a metal is melted in vacuum to be deposited on a synthetic resin sheet, the resin is burnt by the radiation heat generated by the heat of the melting of the metal. This is the reason why the thickness of the plating film formed by the known vacuum deposition is as thin as 0.1∼1.0μ.

The method for forming a plating film on a layered sheet in vacuum, which is shown in FIG. 12, solves the above-described disadvantage, i.e., a metal can be deposited by vapor deposition on the layered sheet in a required thickness. A metal can be deposited by vapor deposition on a resin porous sheet in a required thickness so as to prevent a metallic porous sheet comprising the resin porous sheet from being easily deformed.

As shown in FIG. 12, a vapor deposition vacuum container 51 and a coiled sheet feeding vacuum container 52 communicate with each other through a sheet guiding vacuum path 54. The vapor deposition vacuum container 51 and a sheet cooling vacuum container 55 communicate with each other through a vacuum path 56. The sheet cooling vacuum container 55 and a sheet winding vacuum container 53 communicate with each other through a vacuum path 57.

The sheet feeding vacuum container 52 is large enough to accommodate a layered sheet $3a$ coiled around a roller and is provided with a guide roller 59 for feeding the coiled sheet toward the sheet guiding vacuum path 54. The sheet feeding vacuum container 52 is further provided with a mechanism (not shown) for rotating the coiled sheet $3a$ in the direction shown by an arrow so as to successively feed the coiled sheet $3a$ therefrom.

In the vapor deposition vacuum container 51, the main body 61 of the vapor deposition vacuum container 51 (hereinafter referred to as main body 61) is enclosed by a cooling tank 62 to which a cooling medium is supplied. In this embodiment, the temperature of the cooling medium is $-30°$ C. The main body 61 includes a sheet guide roller 63 disposed in the vicinity of a sheet intake which communicates with the sheet guiding vacuum path 54. The main body further includes rollers 64A, 64B, 64C, and 64D disposed subsequent to the guide roller 63. The rollers 64A, 64B, 64C, and 64D serve as means for guiding and cooling the sheet. The diameters of the rollers 64A and 64C are larger than those of the rollers 64B and 64D. Thus, the layered sheet 3 is capable of contacting the rollers 64A and 64C for a long time so as to cool the layered sheet 3 effectively.

The vapor deposition vacuum container 61 further includes containers 66A and 66B such as crucibles containing metals 65 to be deposited on the layered sheet 3. The containers 66A and 66B are spaced from each other at an appropriate interval. In order to melt the metals 65 contained in the container 66A and 66B, electron beam generators 67A and 67B which irradiate electron beams are mounted on the outer walls of the main body 61. The metal 65 melted by the electron beams is vaporized in the main body 61. The metal 65 is are uniformly evaporated on the whole surface of the layered sheet 3 being transported by the rollers 64A through 64D. The thickness of the metal to be evaporated can be controlled depending on the period of time in which the layered sheet 3 stays in the vapor deposition vacuum container 51.

A roller 68 which serves as means for guiding and cooling the layered sheet 3 is mounted in the cooling vacuum container 55 which communicates with the feed-out opening of the main body 61 through the vacuum path 56, so that the temperature of a metallic porous sheet (A), which is discharged from the vapor deposition vacuum container 51 is reduced to an appropriate temperature before the metallic porous sheet (A) is coiled around a roller mounted in the sheet winding vacuum container 53, which is communicating with the cooling vacuum container 55 through the vacuum path 57.

In the above-described apparatus, the metals 65 vaporized by the electron beams in the vapor deposition vacuum container 51 are vapor-deposited on the layered sheet 3 at a time in the thickness of approximately 300 g/m² before the vapor is discharged from the feed-out opening of the vapor deposition vacuum container 51. In this vapor deposition, the cooling medium of $-30°$ C. is circulated in the cooling tank 62 which encloses the main body 61 so that the temperature inside the main body 61 is reduced. Therefore, the temperature inside the main body 61 is reduced to less than 50° C. although the metals 65 are heated at a high temperature by the electron beams. Further, since the layered sheet 3 is cooled in contact with the rollers 64A through 64D, the temperature thereof is further reduced. Accordingly, even though the layered sheet 3 consists of a resin which is likely to be deformed, the metal 65 can be evaporated on the layered sheet 3 without the layered sheet 3 being not deformed nor cut off by the radiation heat generated when the metals 65 is melted. It is unnecessary to take the stay-time of the layered sheet 3 in the main body 61 into consideration because the layered sheet 3 is not deformed by heat. The metal 65 can be evaporated on the layered sheet 3 in a thickness of approximately 300 g/m² by controlling the vacuum evaporation period of time. That is, the layered sheet 3 is plated in the above-described desired thickness by slowly transporting the layered sheet 3 into the vapor deposition vacuum container 51 whereas the layered sheet 3 is thinly plated by transporting the layered sheet 3 therein at a high speed. The thickness of the metal deposited on the layered sheet 3 can be controlled in the range of 1 g/m²~1,000 g/m².

When the layered sheet 3 is plated in the thickness of, for example, 300 g/m², the structure of the evaporated metal is not uniform because the temperature inside the main body 61 is less than 50° C. Accordingly, a burn off and a sintering are performed in hydrogen-existing atmosphere in the subsequent process so as to form a uniform metallic structure, and adjust the strength of the metal deposited on the layered sheet 3. Therefore, it is possible to make the preferable extensibility thereof. The sintering is carried out at 300°~1,200° C.

A metal selected from the following materials can be evaporated on the layered sheet 3: Cu, Ni, Zn, Sn, Pd, Pb, Co, Al, Mo, Ti, Fe, SUS304, SUS430, 30Cr, Bs and the like. Almost all metal can be used. In depositing two layers of metals on the layered sheet 3 by both the vapor deposition and the electrolytic plating, for example, copper is vapor-deposited on the layered sheet 3 and then, nickel is electrolyzed to be deposited on copper-deposited surface (Cu-Ni). Similarly, the following combinations are preferable: Cu-Sn, Fe-Zn, Mo-Pb, and Ti-Pd.

The method for plating the layered sheet 3 is not limited to the methods shown in FIGS. 2, 3, and 12, but it is plated by the following known methods:
(1) Film forming method by vapor deposition, ion plating, and sputtering
(2) Electroless plating for depositing a metal on the surface of a base material by a reducing reaction
(3) Electrolytic plating
(4) An electrolytic plating is performed after a metal becomes electrically conductive by the above-described film forming method by vacuum evaporation.

(5) An electrolytic plating is performed after a metal becomes electrically conductive by the above-described electroless plating (6) An electrolytic plating is performed after the following substances become electrically conductive by coating a layered sheet with a material selected from the following material or impregnating a material selected from the following material:

(A) carbon such as graphite, carbon black (B) electrically conductive resins such as polyacetylene, polyaniline, polypropyl, polythiophene, polyparaphenylene (C) electrically conductive materials such as metallic powder or a mixture selected from (A) or (B)

The first through eighth embodiment are concerned with a layered sheet comprising a porous foamed sheet and a porous mesh sheet. The following sheets can also be adhered to each other either by a melting or with an adhesive or layered with each other adopting the methods shown in FIGS. 1, 6, and 8 though 11 and plated by the methods shown in FIGS. 2, 3, and 12: A sheet comprising a porous nonwoven fabric and a porous mesh sheet; a porous nonwoven fabric and a foamed sheet; porous foamed, nonwoven, and mesh sheets.

FIG. 13 shows the ninth embodiment showing a method for forming a metallic porous sheet by adhering the following a nonwoven fabric sheet and a mesh sheet to each other by a melting according to the method shown in FIG. 1: A 2.0 mm thick nonwoven fabric sheet consisting of polyester and manufactured by a dry method; and a polyester 40-mesh sheet and the diameter of a thread is 0.7 mm. Then, a porous sheet containing the two sheet layers is plated by the methods shown in FIGS. 2 and 3. The amount of a metal deposited on a metallic porous sheet A' consisting of a metallic nonwoven fabric sheet layer (D) and a metallic mesh sheet layer (C) is 300 g/m$^2$ and the tensile strength thereof is 7.8 kg/2 cm.

When a mesh sheet and a nonwoven fabric sheet are layered with each other in this embodiment, a mesh sheet similar to that used in the first embodiment is preferably used. The thickness of a nonwoven fabric sheet is in the range of 0.5 mm~5.5 mm, and the diameter of a thread is in the range of 0.01 mm~1.0 mm, preferably, 0.05 mm~0.1 mm. The percentage of the porous area thereof ranges from 40 to 99. The following substances are used as the nonwoven fabric sheet in addition to polyester: Synthetic resins such as polyethylene, nylon, polypropylene, rayon; organic substances such as natural fiber, cellulose, paper; inorganic substances such as metals, glass, carbon.

FIG. 14 shows a modification of the ninth embodiment showing a method for forming the metallic porous sheet, A' consisting of the metallic nonwoven fabric layer (D) and the metallic mesh sheet layer (C), swirled to be used as the electrode plate of a cylindrical battery. In the metallic porous sheet A', the metallic nonwoven fabric layer (D) is internally disposed and the metallic mesh sheet layer (C is externally disposed. This construction prevents short fibers of a metal from projecting from the metallic porous sheet A', thus preventing a separator from being damaged.

FIGS. 15A, 15B, and 15C show the tenth, eleventh, and twelfth embodiment of the present invention showing methods for forming a metallic porous sheet comprising a desired number of the metallic nonwoven fabric sheet layers (D) and the metallic mesh layers (C) layered with each other by arranging these sheets in a desired order, respectively. FIG. 15A shows a three-layer construction in which the metallic nonwoven fabric layer (D) is interposed between the metallic mesh sheet layers (C). FIG. 15B shows a three-layer construction in which the metallic mesh sheet layer (C) is interposed between the metallic nonwoven fabric layers (D). FIG. 15C shows a five-layer construction in which the metallic mesh layers (C) and the metallic nonwoven fabric layers (D) are alternately layered with each other.

The above-described number of sheet layers and the order for arranging the sheet layers are selected according to use. The tenth embodiment shown in FIG. 15A, namely, the construction in which the metallic nonwoven layer (D) is interposed between the metallic mesh layers (C) is favorable in electrical conductivity, so that a sheet having this construction can be favorably utilized as a plate of a battery.

FIG. 16 shows the thirteenth embodiment of the present invention showing a metallic porous sheet A" consisting of a metallic foamed sheet layer (B) and the metallic nonwoven fabric sheet layer (D) layered with each other. FIG. 17 shows the fourteenth embodiment of the present invention showing a metallic porous sheet A''' consisting of the metallic foamed sheet layer (B), the metallic mesh sheet layer (C), and the metallic nonwoven fabric sheet layer (D) layered with each other. Similarly to the first embodiment, the metallic porous sheets shown in the thirteenth and fourteenth embodiments are adhered to each other either by melting or with an adhesive or layered with each other and thereafter, plated by a method selected from the methods shown in FIGS. 2, 3, and 12 or the known electroless and electrolytic platings described above.

FIGS. 18A and 18B show the fifteenth and sixteenth embodiments showing modifications of the fourteenth embodiment. As shown in FIGS. 18A and 18B, a thick metallic porous sheet is formed by layering the metallic foamed sheet layer (B), the metallic mesh sheet layer (C), and the metallic nonwoven fabric sheet layer (D) with each other. Such a thick metallic porous sheet as shown in FIGS. 18A and 18B can preferably be used as the plate of a fuel cell as shown in FIG. 19. The fuel cell shown in FIG. 19 comprises a hydrogen electrode base plate 100, an air electrode base plate 101, a catalyst layer 102 interposed between the hydrogen electrode base plate 100 and the air electrode base plate 101, separator plates 103 and 104 disposed on both outer sides thereof. It is necessary to use metallic porous plates as the electrode base plates 100 and 101 and the catalyst layer 102 and a thick metallic porous sheet as the electrode base plates 100 and 101. Therefore, the abovedescribed sheet comprising a plurality of metallic porous sheet layers is preferably used.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for continuously manufacturing a metallic porous sheet consisting essentially of the steps of:
   a. uncoiling a coil of nonwoven porous sheet and a coil of mesh porous sheet, adhering said nonwoven and mesh porous sheets to each other by melting or with an adhesive, or layering said sheets on one another, and coiling the resultant layered sheet around a roller, said layered sheet consisting essentially of said of said nonwoven sheet and said mesh porous sheet;

b. continuously uncoiling said layered sheet from said roller and making said layered sheet conductive;

c. supplying said layered sheet horizontally into a plating tank through an opening therein;

d. jetting plating liquid, at a flow rate of 50 to 200 m/min from a plating liquid supply nozzle positioned in an upper portion of said plating tank to a plating liquid receiving pipe positioned in a lower portion of said plating tank;

e. forcibly applying the plating liquid onto said layered sheet in a direction substantially perpendicular thereto while said layered sheet is being fed horizontally between said plating liquid supply nozzle and said plating liquid receiving pipe;

f. plating said layered sheet at a current density ranging from 100 to 400 A/m$^2$; and g. coiling said layered sheet on which the metal has been deposited around a roller and wherein said plating liquid passes through at least one case inside said plating tank, said case containing ball shaped anodes, said case communicating with said plating liquid supply nozzle, and said layered sheet being made negatively conductive by passing it through conductive rollers disposed outside the opening of said plating tank.

2. The method according to claim 1 wherein said mesh sheet consists of a synthetic resin.

3. The method according to claim 1 wherein said synthetic resin is selected from the group consisting of polyester, polypropylene and polyurethane resin.

4. The method according to claim 1 wherein said mesh sheet consists of natural fiber.

5. The method according to claim 1 wherein said mesh sheet consists of cellulose.

6. The method according to claim 1 wherein said mesh sheet consists of paper.

* * * * *